(12) United States Patent
Isobe et al.

(10) Patent No.: US 11,541,482 B2
(45) Date of Patent: Jan. 3, 2023

(54) METHOD OF PRODUCING GLASS SUBSTRATE HAVING HOLE AND GLASS LAMINATE FOR ANNEALING

(71) Applicant: AGC Inc., Tokyo (JP)

(72) Inventors: Mamoru Isobe, Tokyo (JP); Shigetoshi Mori, Tokyo (JP); Kohei Horiuchi, Tokyo (JP)

(73) Assignee: AGC INC., Tokyo (JP)

( * ) Notice: Subject to any disclaimer, the term of this patent is extended or adjusted under 35 U.S.C. 154(b) by 573 days.

(21) Appl. No.: 16/660,599

(22) Filed: Oct. 22, 2019

(65) Prior Publication Data

US 2020/0130105 A1    Apr. 30, 2020

(30) Foreign Application Priority Data

Oct. 30, 2018 (JP) .............................. JP2018-204276

(51) Int. Cl.

| | |
|---|---|
| *B23K 26/02* | (2014.01) |
| *B23K 26/36* | (2014.01) |
| *B23K 26/38* | (2014.01) |
| *B23K 26/40* | (2014.01) |
| *B23K 26/362* | (2014.01) |
| *B23K 26/382* | (2014.01) |
| *B23K 26/402* | (2014.01) |
| *H01L 23/15* | (2006.01) |
| *B23K 26/70* | (2014.01) |
| *B23K 103/00* | (2006.01) |

(Continued)

(52) U.S. Cl.
CPC .......... *B23K 26/362* (2013.01); *B23K 26/382* (2015.10); *B23K 26/402* (2013.01); *B23K 26/60* (2015.10); *B23K 26/702* (2015.10); *B23K 2103/54* (2018.08); *C03C 15/00* (2013.01); *H01L 23/15* (2013.01)

(58) Field of Classification Search
CPC ............ B23K 26/02; B23K 26/36–364; B23K 26/38–388; B23K 26/40–402; B23K 26/60
See application file for complete search history.

(56) References Cited

U.S. PATENT DOCUMENTS

| | | | |
|---|---|---|---|
| 2004/0069751 A1* | 4/2004 | Yamazaki | B23K 26/0604 257/E29.294 |
| 2007/0139660 A1* | 6/2007 | Tanaka | H01L 21/02691 356/614 |

(Continued)

FOREIGN PATENT DOCUMENTS

| | | |
|---|---|---|
| JP | 2015-107510 A | 6/2015 |
| JP | 2017-066027 A | 4/2017 |

(Continued)

*Primary Examiner* — Michael A Laflame, Jr.
(74) *Attorney, Agent, or Firm* — Foley & Lardner LLP

(57) ABSTRACT

A method of producing a glass substrate having a hole is provided. The method includes preparing the glass substrate having a first surface and a second surface facing each other; forming a hole in the glass substrate with a laser; and annealing the glass substrate placed on a first support substrate having a thermal expansion coefficient whose difference from a thermal expansion coefficient of the glass substrate is less than or equal to 1 ppm/K, where the first support substrate is placed on a second support substrate having a thermal expansion coefficient of less than or equal to 10 ppm/K.

17 Claims, 9 Drawing Sheets

(51) Int. Cl.
 *C03C 15/00* (2006.01)
 *B23K 26/60* (2014.01)

(56) References Cited

U.S. PATENT DOCUMENTS

| | | | | |
|---|---|---|---|---|
| 2007/0180916 A1* | 8/2007 | Tian | ............... | B06B 1/0292 |
| | | | | 73/649 |
| 2007/0184639 A1* | 8/2007 | Tanaka | ............ | B23K 26/066 |
| | | | | 257/E27.113 |
| 2009/0279179 A1* | 11/2009 | Tanaka | ............ | C23C 14/048 |
| | | | | 427/595 |
| 2009/0326279 A1* | 12/2009 | Tonkovich | ......... | B01F 25/431 |
| | | | | 422/198 |
| 2011/0127567 A1* | 6/2011 | Seong | ............... | H01L 33/64 |
| | | | | 438/27 |
| 2015/0183932 A1* | 7/2015 | Katayama | ........... | H05B 33/04 |
| | | | | 438/34 |
| 2017/0096361 A1 | 4/2017 | Horiuchi et al. | | |
| 2017/0103249 A1* | 4/2017 | Jin | ..................... | H05K 3/22 |
| 2017/0225433 A1* | 8/2017 | Okuyama | ............ | C03C 17/38 |
| 2018/0022634 A1 | 1/2018 | Inoue et al. | | |

FOREIGN PATENT DOCUMENTS

| | | |
|---|---|---|
| WO | WO-2014/163130 A1 | 10/2014 |
| WO | WO-2016/129255 A1 | 8/2016 |

\* cited by examiner

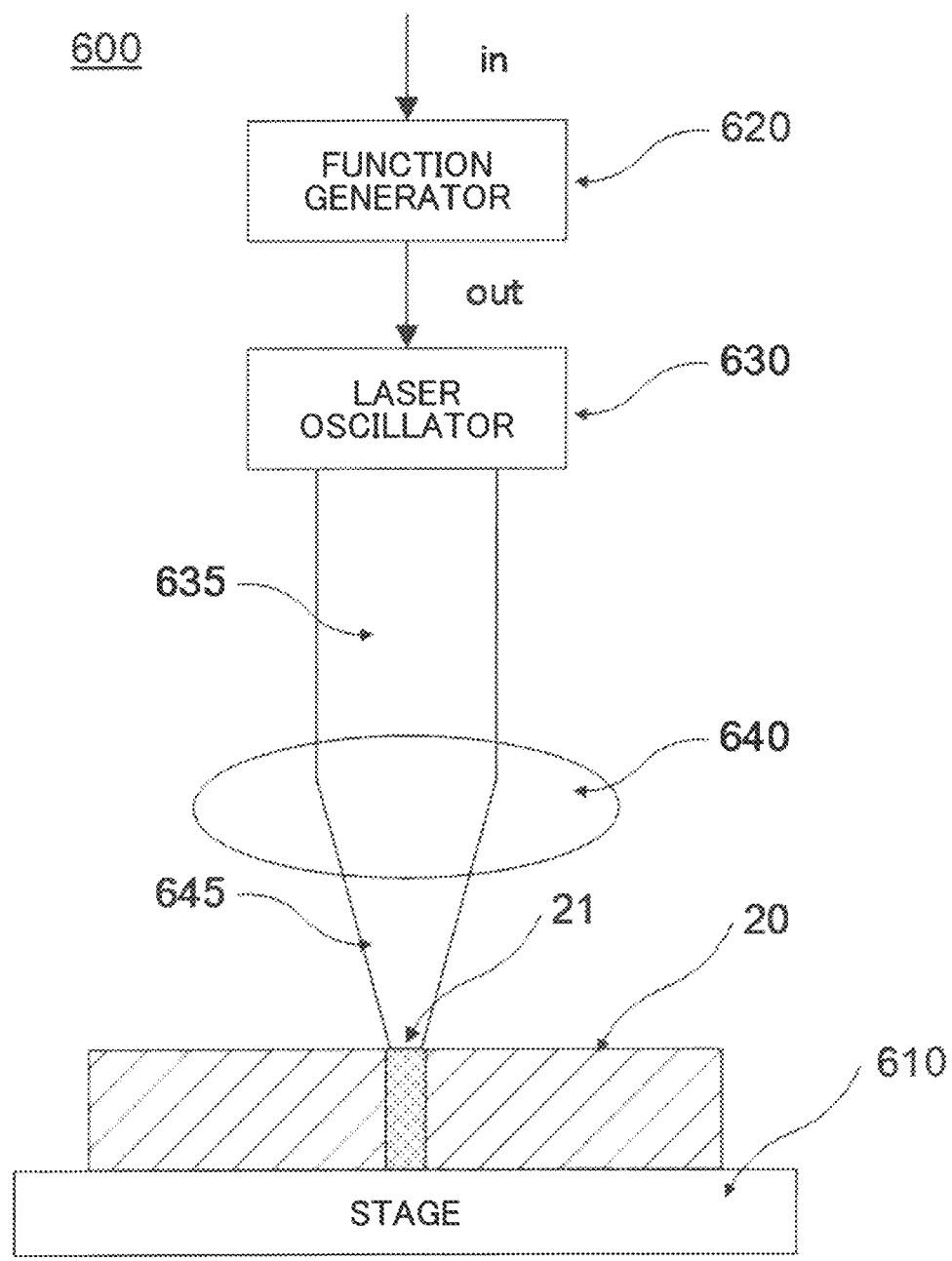

METHOD OF PRODUCING GLASS SUBSTRATE HAVING HOLE AND GLASS LAMINATE FOR ANNEALING

CROSS-REFERENCE TO RELATED APPLICATIONS

The present application is based upon and claims the benefit of priority to Japanese Patent Application No. 2018-204276 filed on Oct. 30, 2018, the entire contents of which are hereby incorporated by reference.

BACKGROUND OF THE INVENTION

1. Field of the Invention

The present disclosure relates to a method of producing a glass substrate having a hole(s) and to a glass laminate for annealing.

2. Description of the Related Art

Conventionally, as a method of forming a minute hole(s) in a glass substrate, a method using laser has been known. For example, Japanese Patent Application Publication No. 2015-107510 discloses a method using a $CO_2$ laser and a method using a short-pulsed laser.

In the method of forming a hole in a glass substrate with irradiation of a $CO_2$ laser, the glass substrate absorbs the $CO_2$ laser, and a hole is formed by thermofusion; therefore, residual stress is generated in a region around the hole by thermofusion. As a method of alleviating the residual stress, annealing the glass substrate having a hole formed has been known.

However, there has been a problem that when annealing the glass substrate, scratches are generated on the surface of the glass substrate due to friction between the glass substrate and a support substrate on which the glass substrate is placed. In particular, radially spreading scratches are noticeable because the glass substrate rubbed against the support substrate by expansion and contraction during the course of annealing.

SUMMARY OF THE INVENTION

The present disclosure provides a method of producing a glass substrate having a hole. The method includes preparing the glass substrate having a first surface and a second surface facing each other; forming a hole in the glass substrate with a laser; and annealing the glass substrate placed on a first support substrate having a thermal expansion coefficient whose difference from a thermal expansion coefficient of the glass substrate is less than or equal to 1 ppm/K, where the first support substrate is placed on a second support substrate having a thermal expansion coefficient of less than or equal to 10 ppm/K.

BRIEF DESCRIPTION OF DRAWINGS

FIG. 6 is a diagram schematically illustrating a laser irradiator according to the second embodiment in the present disclosure;

DESCRIPTION OF THE PREFERRED EMBODIMENTS

According to a production method in the present disclosure, annealing can be performed while alleviating the residual stress around a hole(s), and as well, controlling generation of scratches on the surface of the glass substrate.

First, an annealing step in a production method in the present disclosure will be described with reference to FIG. 1 and FIG. 2.

Figure 1:
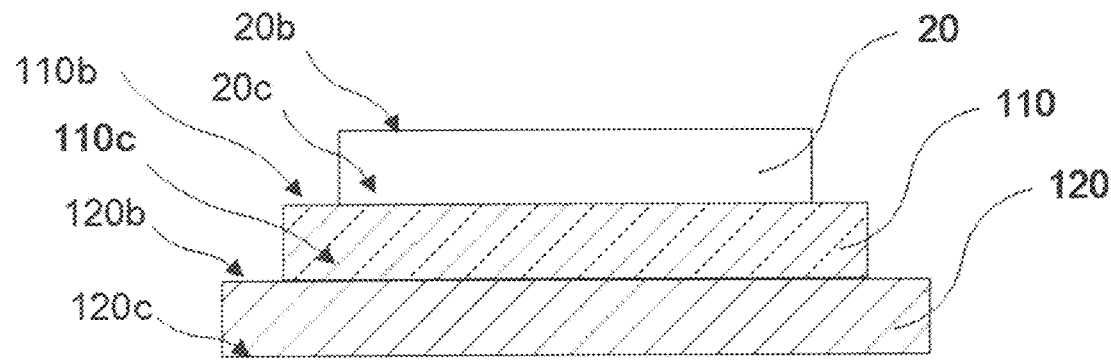
FIG. 1 is a schematic side view illustrating a placement form of a glass substrate during annealing in the present disclosure.
Figure 2:
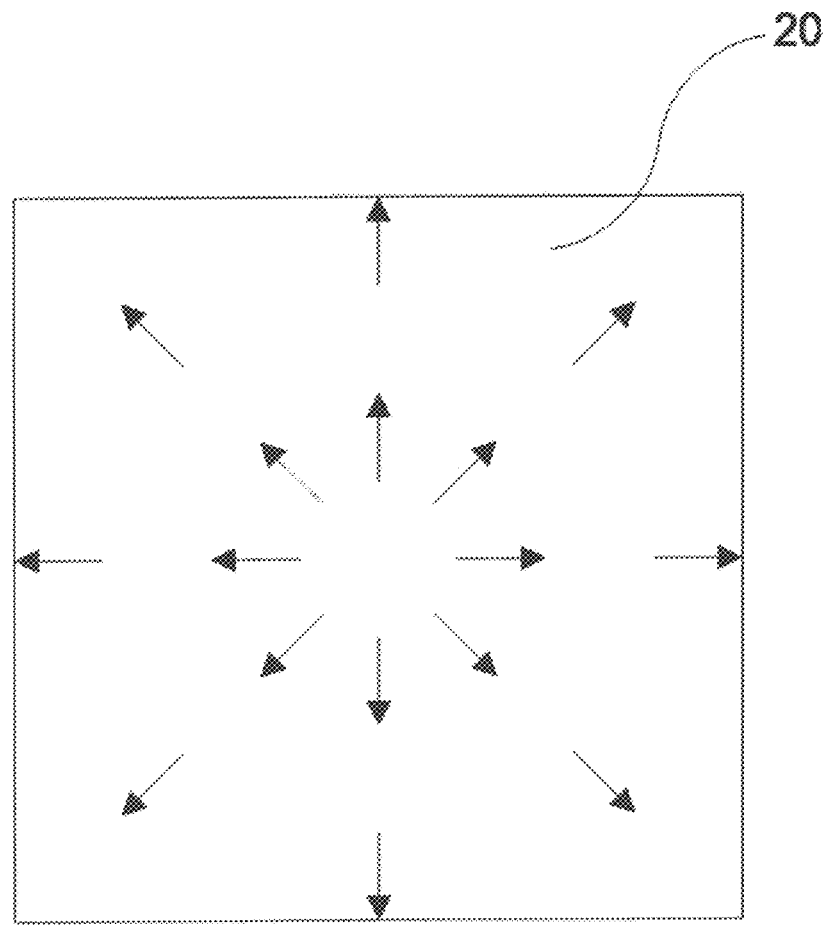
FIG. 2 is a top view illustrating the direction of thermal contraction of a glass substrate in the course of annealing in the present disclosure.

FIG. 1 is a side view illustrating a placement form of a glass substrate 20 in the annealing step. As illustrated in FIG. 1, the glass substrate 20 is placed on a first support substrate 110 having a thermal expansion coefficient whose difference from the thermal expansion coefficient of the glass substrate 20 is less than or equal to 1 ppm/K, and the first support substrate 110 is placed on a second support substrate 120 having a thermal expansion coefficient of less than or equal to 10 ppm/K. In the present description, as the thermal expansion coefficient of glass, an average value in a temperature range from 50° C. to 200° C. is adopted. The temperature range from 50° C. to 200° C. is a common range when measuring the thermal expansion coefficient of glass. Also, when the temperature of glass exceeds 200° C., thermal expansion of the glass tends to be curbed. The first support substrate 110 has a first surface 110b and a second surface 110c, and the second support substrate 120 has a first surface 120b and a second surface 120c. The first surface 110b of the first support substrate 110 displaceably contacts a second surface 20c of the glass substrate 20, and the second surface 110c of the first support substrate 110 displaceably contacts the first surface 120b of the second support substrate 120.

As the first support substrate 110, a substrate having a thermal expansion coefficient whose difference from the thermal expansion coefficient of the glass substrate 20 is less than or equal to 1 ppm/K, is selected. The difference in the thermal expansion coefficient falling within this range enables to control friction between the second surface 20c of the glass substrate 20 and the first surface 110b of the first support substrate 110 during the course of increasing the temperature from room temperature to the annealing temperature. It is also possible to control friction between the second surface 20c of the glass substrate 20 and the first surface 110b of the first support substrate 110 during the course of decreasing the temperature from the annealing temperature to room temperature. As a result, generation of scratches due to friction can be controlled significantly. The difference in the thermal expansion coefficient is favorably less than or equal to 0.1 ppm/K, and more favorably less than or equal to 0.05 ppm/K to further control generation of scratches.

The first support substrate 110 satisfying the above conditions is particularly effective in controlling radial spread scratches. Annealing causes the glass substrate 20 to thermally expand. FIG. 2 is a top view schematically illustrating directions of thermal expansion of the glass substrate 20. The glass substrate 20 thermally expands in the directions of the arrows in FIG. 2 during the course of increasing the temperature from room temperature to the annealing temperature. Therefore, friction occurs between the second surface 20c of the glass substrate 20 and the first surface 110b of the first support substrate 110 particularly in the directions of the arrows in FIG. 2, and thereby, radially spread scratches are generated on the second surface 20c of the glass substrate 20. By using the first support substrate 110 having a small difference in the thermal expansion coefficient with the glass substrate 20, such scratches can be controlled significantly.

The material of the first support substrate 110 is not limited in particular as long as the shape is maintained at the annealing temperature. For example, metal, ceramics, glass, and the like may be considered. Favorably, if glass is selected, the composition and physical properties are close to the glass substrate 20; therefore, not only generation of scratches can be controlled easier, but also change in properties on the glass surface due to chemical reactions between the glass substrate and the support substrate at a high temperature can be controlled easier. More favorably, a glass of the same composition as the glass substrate 20 is selected. By using a glass with the same composition as the glass substrate 20, the difference in the thermal expansion coefficient can be virtually eliminated.

The first surface 110b of the first support substrate 110 may be applied with roughening. A surface roughness greater than or equal to 0.1 μm in term of the arithmetic mean roughness Ra is favorable because it becomes possible to avoid a phenomenon in which the first surface 110b firmly contacts the second surface 20c of the glass substrate 20, to an extent that peeling off becomes difficult. Ra being greater than or equal to 0.2 μm is more favorable, and Ra being greater than or equal to 0.3 μm is even more favorable to be effective. Meanwhile, Ra is also favorable to be less than or equal to 2.0 μm because generation of scratches on the second surface 20c of the glass substrate 20 can be controlled. Ra being less than or equal to 1.5 μm is more favorable, and Ra being less than or equal to 1.5 μm is even more favorable to be effective.

The method of roughening is not limited in particular. For example, the method may be a mechanical method such as sandblasting or hairline formation, or may be a chemical method such as chemical liquid treatment. Also, a mechanical method may be combined with a chemical method.

Also, in order to prevent the first support substrate 110 from firmly contacting the glass substrate 20, a method other than roughening described above may be used. For example, coating instead of roughening may be applied to the first surface 110b of the first support substrate 110, or a protective film may be provided between the first support substrate 110 and the glass substrate 20.

The first support substrate 110 is favorably selected to be larger than the glass substrate 20. This enables to prevent the outer periphery of the glass substrate 20 otherwise not supported by the support substrate from hanging down to be distorted by its own weight when becoming soft by heating.

The sides of the first surface 110b of the first support substrate 110 may be chamfered. Chamfering enables to control generation of scratches on the surface of the glass substrate 20 due to collision with the corners or sides of the first support substrate, or generation of scratches on the surface of the glass substrate 20 due to fragments of a chipped corner or side of the first support substrate.

The second support substrate 120 is selected from among those having a thermal expansion coefficient of less than or equal to 10 ppm/K. By selecting a support substrate having a thermal expansion coefficient falling within this range, the second support substrate hardly deforms during the course of increasing the temperature from room temperature to the annealing temperature and during the course of decreasing the temperature from the annealing temperature to room temperature. Thus, defamation of the second support substrate 120 can be controlled for repeated use (i.e., repeated heating and cooling), and thereby, the first support substrate 110 and the glass substrate 20 can be stably supported, and distortion of their shapes can be controlled. The thermal expansion coefficient of the second support substrate 120 is favorably less than or equal to 5 ppm/K, and more favorably less than or equal to 1 ppm/K to be less likely to deform, which is effective.

Favorably, the flatness of the second support substrate 120 on the first surface 120b in contact with the first support substrate 110 is less than or equal to 600 μm. The flatness of the second support substrate 120 falling within the range enables to maintain the flatness of the first support substrate 110 and the glass substrate 20 placed on the second support substrate 120, and thereby, enables to produce the glass substrate having a hole(s) without distortion.

The second support substrate 120 is selected to be larger than the first support substrate 110. This enables to prevent the outer periphery of the first support substrate 110 and the glass substrate 20 otherwise protruding out of the second support substrate from hanging down to be distorted when becoming soft by heating.

The material of the second support substrate 120 is not limited in particular as long as deformation is small at the annealing temperature. For example, quartz glass, ceramics, and the like are favorable because of small deformation at the annealing temperatures.

In the case of the second support substrate being a glass material such as quartz glass, it is favorable to select a material having a strain point higher than or equal to the annealing temperature.

Annealing is applied to the glass substrate 20 configured as such. It is favorable to hold the glass substrate 20 at a temperature higher than or equal to the strain point and lower than or equal to softening point, for longer than or equal to 100 minutes. It is more favorable to hold the glass substrate 20 longer than or equal to 300 minutes. Further, it is favorable to lower the temperature down to 40° C. taking a period of time longer than or equal to 200 minutes, and is more favorable to lower the temperature taking a period of time longer than or equal to 400 minutes. This allows to sufficiently remove the residual stress around a hole(s) 22 in the glass substrate 20.

By performing the annealing step as described above, it is possible to produce a glass substrate having a hole(s) while controlling generation of scratches.

Also, by performing the annealing step as described above, there is an effect of making thermal contraction difficult to occur in a later step. In the case of forming an interposer with a glass substrate having holes produced in the present disclosure, a later step is provided in which the holes 22 are filled with a conductive material, and applied with heat treatment. However, during this heat treatment, there has been a problem that the glass substrate 20 is distorted due to thermal contraction. This is caused by minute structural change in the glass caused by reheating after the production of the glass substrate. However, by providing an annealing step as in the present disclosure, the structural change occurs during the annealing, the structural change does not occur during the heat treatment at the later step, and thus, the glass substrate becomes less likely to thermally contract.

Next, steps in the production method in the present disclosure will be described in detail. The first embodiment relates to a method that can be applied when forming a hole by using any type of laser. In particular, the first embodiment is effective when forming a hole by using a laser having a high thermal influence on the glass substrate. Meanwhile, the second embodiment is effective when forming a hole or a modified part by using a laser having a smaller thermal influence on the glass substrate, and can reduce the influence of scratches to be less than in the first embodiment.

First Embodiment

First, a method of producing a glass substrate having a hole according to the first embodiment in the present disclosure will be described with reference to FIGS. 3 to 4. Although laser irradiation in the first embodiment is not limited in particular in terms of the laser to be used, in the following description, a case will be described in which a $CO_2$ laser having a relatively large thermal influence on the glass substrate is used.

Figure 3:
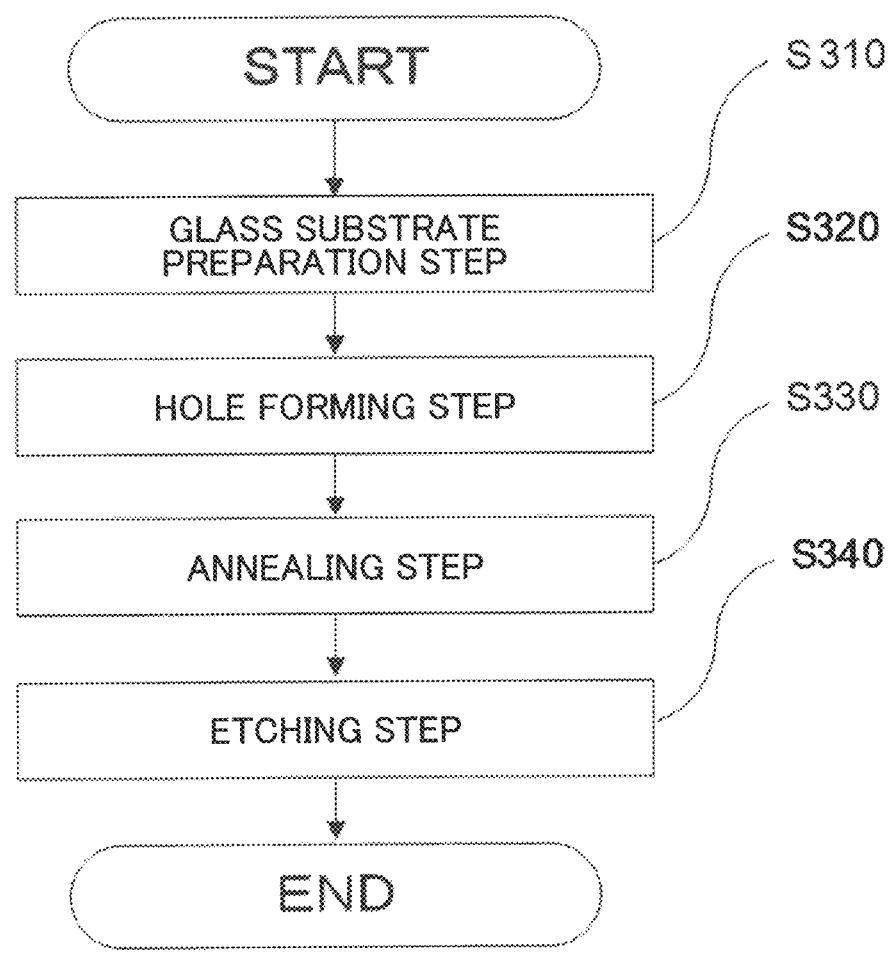
FIG. 3 is a diagram schematically illustrating a flow of producing a glass substrate having a hole(s) according to a first embodiment in the present disclosure.

FIG. 3 schematically illustrates a flow of a method of producing a glass substrate having a hole according to the first embodiment in the present disclosure.

As illustrated in FIG. 3, the production method of a glass substrate having a hole according to the first embodiment in the present disclosure includes the following steps:

(Step S310) a step of preparing a glass substrate having first and second surfaces facing each other (glass substrate preparation step);

(Step S320) a step of forming a hole by having the first surface of the glass substrate irradiated with a $CO_2$ laser (hole forming step);

(Step S330) a step of annealing in which the glass substrate is placed on a first support substrate having a thermal expansion coefficient whose difference from the thermal expansion coefficient of the glass substrate 20 is less than or equal to 1 ppm/K, and the first support substrate 110 is placed on a second support substrate having a thermal expansion coefficient of less than or equal to 10 ppm/K, so as to anneal the glass substrate (annealing step); and (Step S340) a step of etching the glass substrate (etching step).

Note that Step S340 (etching step) is an optional step and may not be performed.

In the following, with reference to FIG. 4, each step will be described.

(Step S310)

First, a glass substrate 20 to be processed is prepared. The glass substrate has a first surface 20b and a second surfaces 20c facing each other.

(Step S320)

Next, a hole is formed in the glass substrate by using a laser. For example, a laser irradiator illustrated in FIG. 4 may be used for the hole forming step. As illustrated in FIG. 4, a laser irradiator 400 includes a stage 410, a laser oscillator 430, and a condenser lens 440. The glass substrate 20 is placed such that the second surface 20c faces the stage. The glass substrate may be fixed to the stage. The fixing method is not limited in particular; it may be fixed by using a jig or the like, or may be fixed by attraction or by an adhesive. In the case of attraction, it may be, for example, vacuum attraction or electrostatic attraction.

Next, an oscillating laser beam 435 is emitted from the laser oscillator 430. The laser may be oscillated continuously or pulsed.

The laser beam 435 enters the condenser lens 440 to be condensed to form a laser beam 445. Note that the configuration of laser irradiator 400 is not limited as such, and may include, for example, a beam adjusting optical system between the laser oscillator 430 and the concentrator lens 440.

The laser beam 445 enters the first surface 20b of the glass substrate 20 to form a hole 22.

Here, as the laser oscillator 430 in the first embodiment, for example, a $CO_2$ laser may be selected. Note that as described above, the laser oscillator 430 is not limited as such. The laser oscillator 430 may be, for example, a He—Ne laser, Ar ion laser, excimer XeF laser, Er:YAG laser, Nd:YAG laser, the second or third radiofrequency of Nd:YAG laser, ruby laser, fiber laser, or the like.

A laser having a wavelength in the infrared region such as a $CO_2$ laser has a characteristic of being absorbed by a glass substrate. When processing is performed by using such a laser, the incidence of the laser beam 445 causes thermofusion in the glass substrate 20 to form a hole 22. Also, the thermofusion generates residual stress around the hole 22 in the glass substrate 20 after processing. The residual stress around the formed hole 22 may be, for example, greater than or equal to 50 MPa.

(Step S330)

Then, the glass substrate is placed on the first support substrate having a thermal expansion coefficient whose difference from the thermal expansion coefficient of the glass substrate 20 is less than or equal to 1 ppm/K, and the first support substrate 110 is placed on the second support substrate having a thermal expansion coefficient of less than or equal to 10 ppm/K, so as to anneal the glass substrate. Annealing the glass substrate 20 enables to remove the residual stress around the hole 22. Removing the residual stress around the hole 22 enables to control generation of cracks and fragments around the opening.

In addition, the annealing step has an effect of controlling thermal contraction of the glass substrate 20 in a later step. In the case of forming an interposer with a glass substrate having holes produced in the present disclosure, a later step is provided in which the holes 22 are filled with a conductive material, and applied with heat treatment. However, during this heat treatment, there has been a problem that the glass substrate 20 is distorted due to thermal contraction. This is caused by minute structural change in the glass caused by reheating after the production of the glass substrate. However, by providing an annealing step as in the present disclosure, the structural change occurs during the annealing; therefore, the structural change does not occur during the heat treatment at a later step, and thus, the glass substrate becomes less likely to thermally contract.

Also, in the case of providing an etching step following the annealing step for the purpose of smoothing the inner wall of the hole or enlarging the diameter of the hole, it is favorable to perform the annealing step prior to the etching step. This enables to control the progress of the etching that would be otherwise varied due to the residual stress around the hole, which would make the inside wall of the hole uneven.

In the annealing step in the present disclosure, as described above, the residual stress around the hole of the glass substrate can be alleviated, and generation of scratches can be controlled while preventing thermal contraction of the glass substrate in a later step.

(Step S340)

After the annealing step, the glass substrate 20 may be etched. Note that this step may be skipped if not required. Etching smooths the inner wall of the hole 22 and removes debris. By adjusting the etching time, it is also possible to increase the diameter of the hole as necessary. By performing the annealing step prior to the etching step, it is possible to avoid uneven progress of the etching.

Second Embodiment

Next, a method of producing a glass substrate having a hole according to a second embodiment in the present disclosure will be described with reference to FIGS. 5 to 7C. The second embodiment is effective in the case of performing a laser irradiation step that has a relatively small thermal influence on the glass substrate. In particular, in an etching step performed in the second embodiment, it is possible to further control generation of scratches as compared to the case where etching is performed at Step S340 in the first embodiment.

Figure 5:
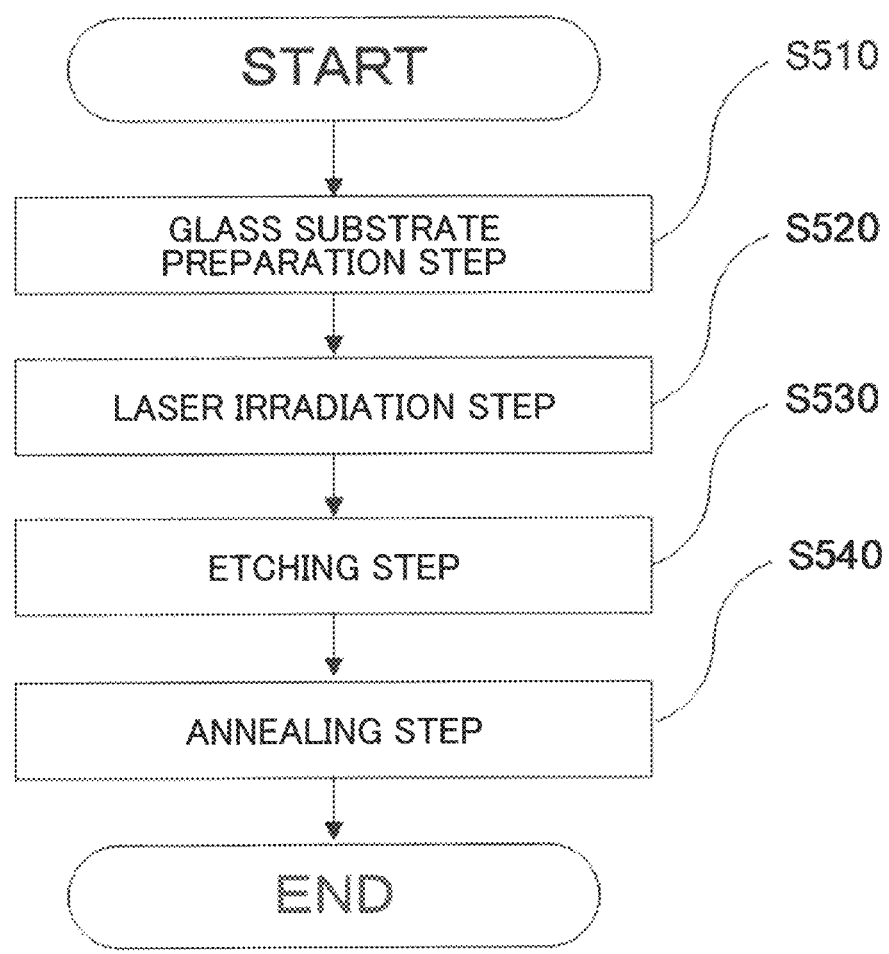
FIG. 5 is a diagram schematically illustrating a flow of producing a glass substrate having a hole(s) according to a second embodiment in the present disclosure.
Figure 7A:
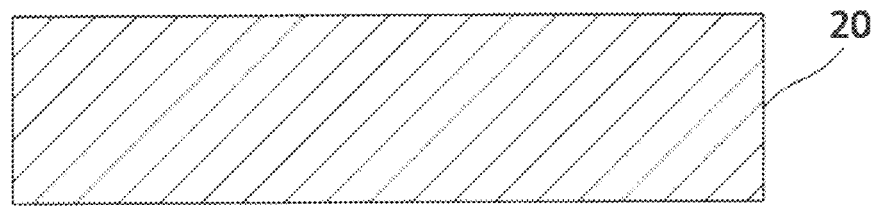
FIGS. 7A-7C are side views schematically illustrating how a modified part and a hole are formed in a glass substrate according to the second embodiment in the present disclosure.
Figure 7B:
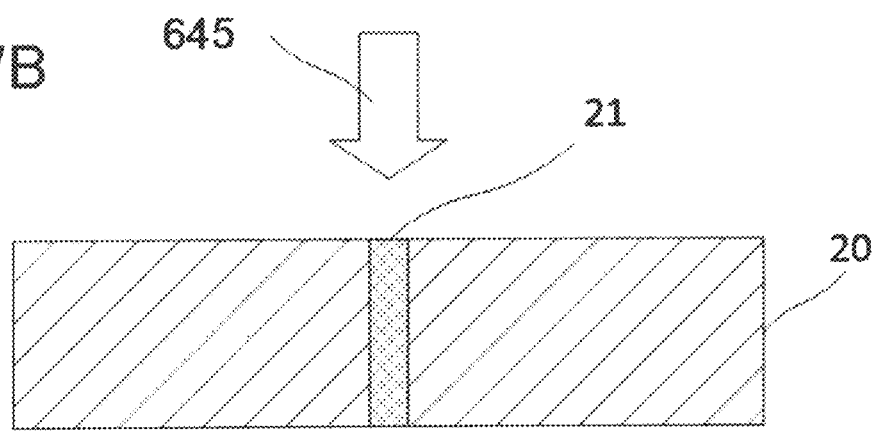
Figure 7C:
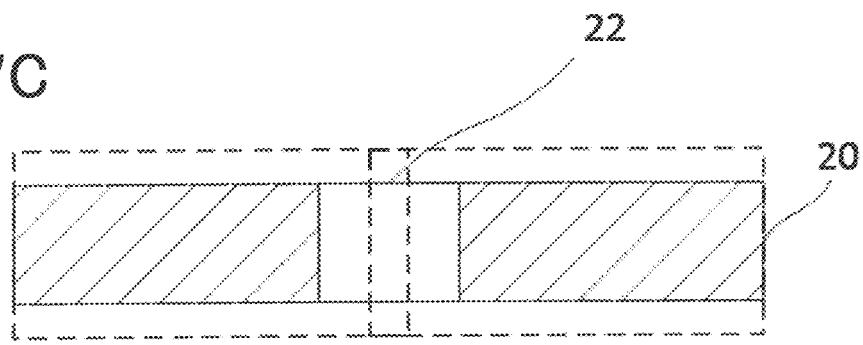

FIG. 5 schematically illustrates a flow of a method of producing a glass substrate having a hole according to the second embodiment in the present disclosure. FIGS. 7A to 7C are cross-sectional views of a glass substrate schematically illustrating how a modified part is formed in the glass substrate in a laser irradiation step (7B) and a hole is formed in the etching step (7C).

As illustrated in FIG. 5, the production method of a glass substrate having a hole according to the second embodiment in the present disclosure includes the following steps:

(Step S510) a step of preparing a glass substrate having first and second surfaces facing each other (glass substrate preparation step);

(Step S520) a step of having the first surface of the glass substrate irradiated with a pulsed laser having a wavelength of less than or equal to 1100 nm, to form a modified part in the glass substrate (laser irradiation step);

(Step S530) a step of etching the modified part, to form a hole in the glass substrate (etching step); and (Step S540) a step of annealing in which the glass substrate is placed on a first support substrate having a thermal expansion coefficient whose difference from the thermal expansion coefficient of the glass substrate 20 is less than or equal to 1 ppm/K, and the first support substrate 110 is placed on a second support substrate having a thermal expansion coefficient of less than or equal to 10 ppm/K, so as to anneal the glass substrate (annealing step).

(Step S510)

First, a glass substrate 20 is prepared. The glass substrate 20 has a first surface 20b and a second surfaces 20c facing each other.

(Step S520)

Next, the glass substrate is irradiated with a pulsed laser having a wavelength of less than or equal to 1100 nm, to form a modified part 21 in the glass substrate 20. For example, for irradiation of the pulsed laser, for example, a laser irradiator as illustrated in FIG. 6 may be used. As illustrated in FIG. 6, a laser irradiator 600 includes a stage 610, a function generator 620, a laser oscillator 630, and a condenser lens 640. The glass substrate 20 is placed such that the second surface 20c faces the stage. The glass substrate may be fixed to the stage. The fixing method is not limited in particular; it may be fixed by using a jig or the like, or may be fixed by attraction or by an adhesive. In the case of attraction, it may be, for example, vacuum attraction or electrostatic attraction.

First, a gate signal is input into the function generator 620. The function generator 620 outputs a predetermined square-wave signal in response to the input gate signal. The square-wave signal is input into the laser oscillator 630, and the laser oscillator 630 emits a pulsed oscillating laser beam 635 based on the square-wave signal.

The pulsed laser beam 635 enters the condenser lens 640 to be condensed to form a laser beam 645. Note that the configuration of the laser irradiator 600 is not limited as such, and may include, for example, a beam adjusting optical system between laser oscillator 630 and the condenser lens 640.

A pulsed laser beam 645 enters the first surface 20b of the glass substrate 20 to form a modified part 21. FIG. 7B schematically illustrates how a modified part 21 is formed in the glass substrate 20 by irradiation of the pulsed laser beam 645.

Note that depending on conditions of the laser irradiation, a hole may be formed instead of the modified part, or a minute hole may be formed around the center of the modified part. The hole may go through the glass substrate 20 or may be void-shaped in which a discontinuous cavity part is formed. Processing with a modified part is favorable because the part is particularly less affected by thermal influence.

Here, a pulsed oscillating laser having a wavelength with a low absorption rate into the glass substrate 20 can be used to form the modified part or hole.

The wavelength of the pulsed laser beam 645 is favorably less than or equal to 1100 nm, more favorably less than or equal to 850 nm, and even more favorably less than or equal to 360 nm. It is favorable to use a laser in a wavelength range in which the absorption rate into a glass is low in the processing because thermofusion of the glass substrate can be controlled, and thereby, the stress around the hole can be reduced. Also, a short-wavelength laser represented by ultraviolet light is suitable for forming a hole or a modified part in a glass substrate because the laser has high energy, and thereby, a phenomenon of multiphoton absorption is likely to occur in the glass substrate. Therefore, the wavelength of the pulsed laser beam 645 falling within the range described above makes the thermal influence low, under which a modified part or hole can be formed.

As a laser having a wavelength of less than or equal to 1100 nm, for example, Nd:YAG laser (wavelength: approximately 1064 nm); the second radiofrequency (wavelength: approximately 532 nm), third radiofrequency (wavelength: approximately 355 nm), or fourth radiofrequency (wavelength: approximately 266 nm) of Nd:YAG laser; excimer XeF laser (wavelength: approximately 351 nm); excimer XeCl laser (wavelength: approximately 308 nm); excimer KrF laser (wavelength: approximately 248 nm); excimer ArF laser (wavelength: approximately 193 nm); fiber laser (wavelength: approximately 1060 nm); or the like may be listed. Note that these lasers are merely examples and other types of lasers may be used.

The pulse width of the pulsed laser beam 645 is favorably less than 1 nsec, more favorably less than or equal to 100 psec, and even more favorably less than or equal to 10 psec. The pulse width falling with a range described above makes the peak of the laser beam in a single pulse intense enough to cause a phenomenon of multiphoton absorption in glass; therefore, it is easier to form a modified part or hole and the thermal influence is less. Also, a pulse width greater than or equal to 100 fsec is generally used. This is the lower limit of the general-purpose laser technology.

(Step S530)

Next, the modified part 21 is removed by etching to form and enlarge a hole 22 in the glass substrate 20.

The second embodiment does not require an annealing step performed prior to the etching step because laser irradiation is performed by a method that has a small thermal influence on the glass substrate. After laser irradiation, the residual stress around the modified part or hole is, for example, less than or equal to 30 MPa, and more favorably less than or equal to 20 MPa. The residual stress falling within this range enables etching to proceed uniformly even if the etching step is performed without providing an annealing step.

FIG. 7C schematically illustrates a state where the modified part 21 has been removed by the etching and the hole 22 is formed. Dotted lines in FIG. 7C denote the boundary between the glass substrate 20 and the modified part 21 before etching, and solid lines denote the boundary between the glass substrate 20 after etching and the hole 22 formed after the modified part 21 has been removed.

In the case where the glass substrate 20 has a modified part 21, the etching rate of the modified part 21 is higher than that of a non-modified part; therefore, the modified part 21 is selectively removed and a hole 22 is formed in the glass substrate. Also, after the hole 22 has been formed in the glass substrate, the diameter of the hole 22 is enlarged by continuing the etching.

The etchant is selected from among those having an etching rate faster for the modified part than the etching rate for the glass. For example, the etchant may be a compound such as fluoric acid, sulfuric acid, nitric acid, or hydrochloric acid; an aqueous solution of the compound; or a solution in which two or more of the compounds are mixed.

The etching time is selected depending on the size of the modified part and the desired diameter of the hole. The diameter of the hole can be controlled by adjusting the etching time.

(Step S540)

Next, annealing is applied to the glass substrate 20 having the hole 22 formed. Conventionally, in a method of forming a modified part 21 by using a short-wavelength pulsed laser, it has been known that the process does not require annealing because residual stress is hardly generated around a hole due to thermofusion as described above. However, even in such a process, as described above, during the course of producing an interposer, in the step of filling the hole with a conductive material and performing heat treatment, a problem arises in which the glass substrate is distorted due to thermal contraction. Therefore, even in a method using a short-wavelength pulsed laser, by providing an annealing step of the glass substrate, thermal contraction can be controlled in a later step of heat treatment.

Further, in the second embodiment, performing the annealing step after the etching step enables to control generation of deep scratches on the surface of the glass substrate. This will be described below.

In a method of forming a hole in a glass substrate by a thermal process using a $CO_2$ laser or the like, it has been necessary to alleviate residual stress generated around a hole due to laser irradiation in an annealing step, so as to control a variation of etching progress on the inside wall of the hole in an etching step. In contrast, in the second embodiment, a short-wavelength pulsed laser is used to form a modified part by a method having a low thermal influence; therefore, the residual stress is low and the annealing step can be performed after the etching step.

Unlike the case of performing the etching step after the annealing step, performing the annealing step after the etching step enables to prevent scratches, which would be generated by handling and/or friction with the support substrate in the annealing step, from deepening and enlarging in the etching step.

This brings the following effects:

(1) It is possible to reduce the number of scratches because a shallow and non-problematic scratch after the annealing step can be prevented from becoming manifest due to a subsequent etching step. This is because the annealing step is performed after the etching step.

(2) Further, it is possible to prevent a scratch that has become manifest after the annealing step from deepening and enlarging in a subsequent etching step. This is because the annealing step is performed after the etching step. In the case of using a glass substrate as an interposer, scratches on the glass substrate are undesirable because the scratches may bring inconvenience, such as broken wires formed on the glass substrate. In particular, large scratches or deep scratches are highly likely to cause such inconvenience. Therefore, not only reducing the number of scratches, but also preventing a scratch from being deepened or expanded are important for improving the product quality or improving the yield of products meeting a certain level of quality in the production of interposers.

In this way, in the second embodiment, by performing the annealing step after the etching step, it is possible to reduce the number of scratches that would otherwise become manifest, and further, to prevent a scratch from deepening and enlarging the depth and expansion of the scratch; therefore, glass substrates can be produced that are less affected by scratches.

(Glass Laminate for Annealing)

A glass laminate for annealing in the present disclosure is a glass laminate having a configuration as illustrated in FIG. 1, which is used in the annealing step in the first and second embodiments. As illustrated in FIG. 1, the glass laminate includes a glass substrate 20 having a hole(s), a first support substrate 110 placed under the glass substrate, and a second support substrate 120 placed under the first support substrate 110; the first support substrate 110 has a thermal expansion coefficient whose difference from the thermal expansion coefficient of the glass substrate 20 is less than or equal to 1 ppm/K, and the thermal expansion coefficient of the second support substrate 120 is less than or equal to 10 ppm/K.

EXAMPLES

Example 1

By using the method described in the first embodiment, a glass substrate having holes was produced by the following steps.

First, a glass substrate having facing surfaces was prepared. As the glass substrate, a rectangular alkali-free glass having a size of 400 mm×300 mm×0.4 mm thick was used. The thermal expansion coefficient of the glass substrate was 3.8 ppm/K. The strain point was at 670° C. and the softening point was at 950° C.

Figure 4:
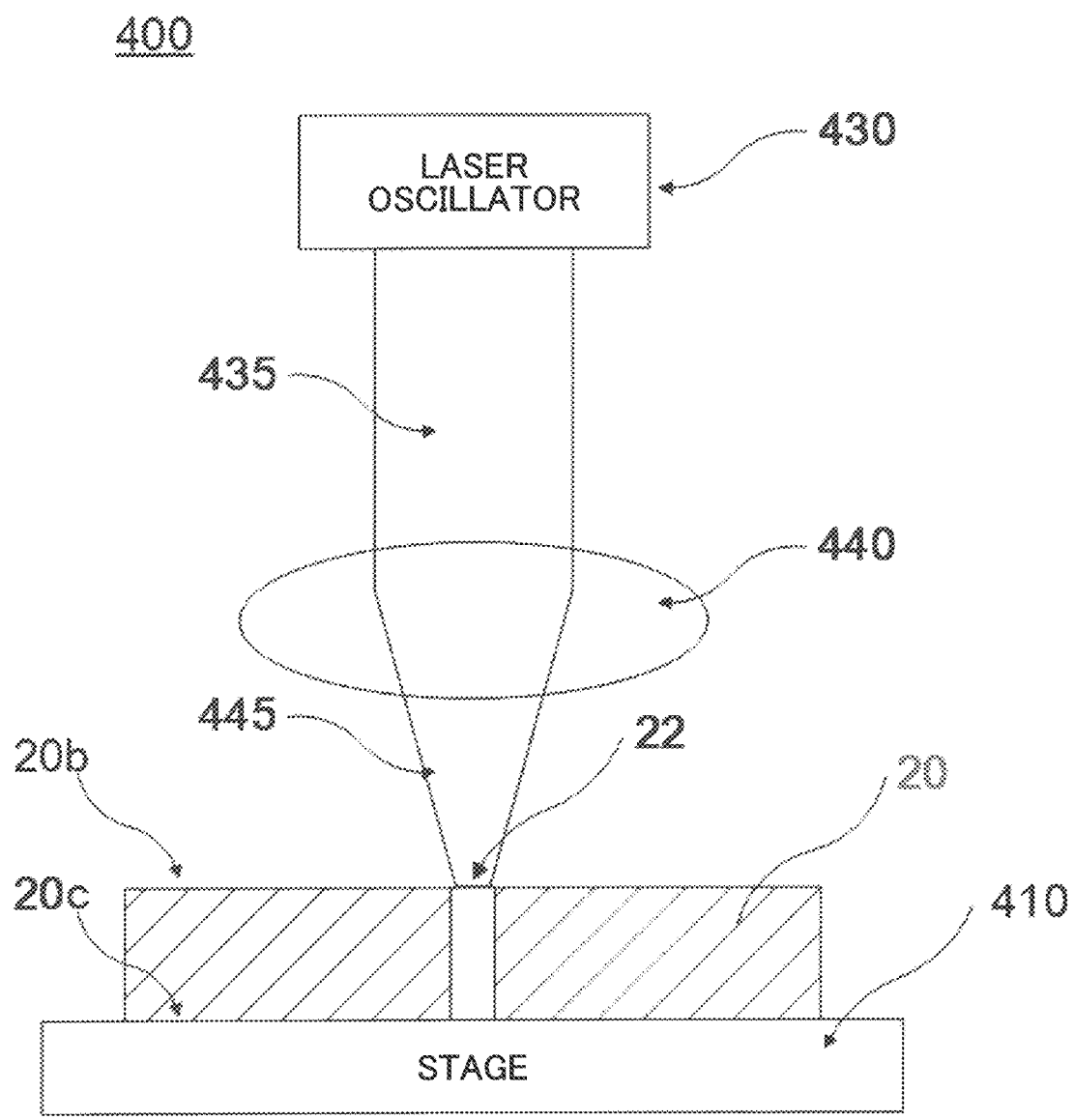
FIG. 4 is a diagram schematically illustrating a laser irradiator according to the first embodiment in the present disclosure.

Next, by using a laser irradiator having a configuration as illustrated in FIG. 4, the glass substrate was irradiated with a laser to form multiple through-holes. As the laser oscillator, a $CO_2$ laser having a wavelength of 10.6 μm was used, and the laser was oscillated continuously.

Next, an annealing step was performed. The annealing step was performed using a slow cooling furnace. The glass substrate was placed as in the configuration illustrated in FIG. 1 to be annealed. In other words, the glass substrate was placed on the first support substrate and the first support substrate was placed on the second support substrate. The glass substrate was placed such that the second surface faces the first support substrate and the first support substrate was placed such that the second surface faces the second support substrate.

As the first support substrate, a glass having the same composition as the glass substrate having the holes formed was used. Therefore, there was no difference in the thermal expansion coefficient between the glass substrate and the first support substrate. The dimensions of the first support substrate were 830 mm×700 mm×0.6 mm thick. The first surface of the first support substrate in contact with the glass substrate was roughened by etching, and the surface roughness was 0.45 μm in terms of Ra.

As the second support substrate, a quartz glass having a thermal expansion coefficient of 0.55 ppm/K was used. Also, the dimensions of the second support substrate were 940 mm×750 mm×3 mm thick.

The glass substrate was held in the slow cooling furnace at 711° C. for two hours, then, cooled down to 650° C. at a rate of 12° C./h, and thereafter, left to cool naturally.

Figure 8:
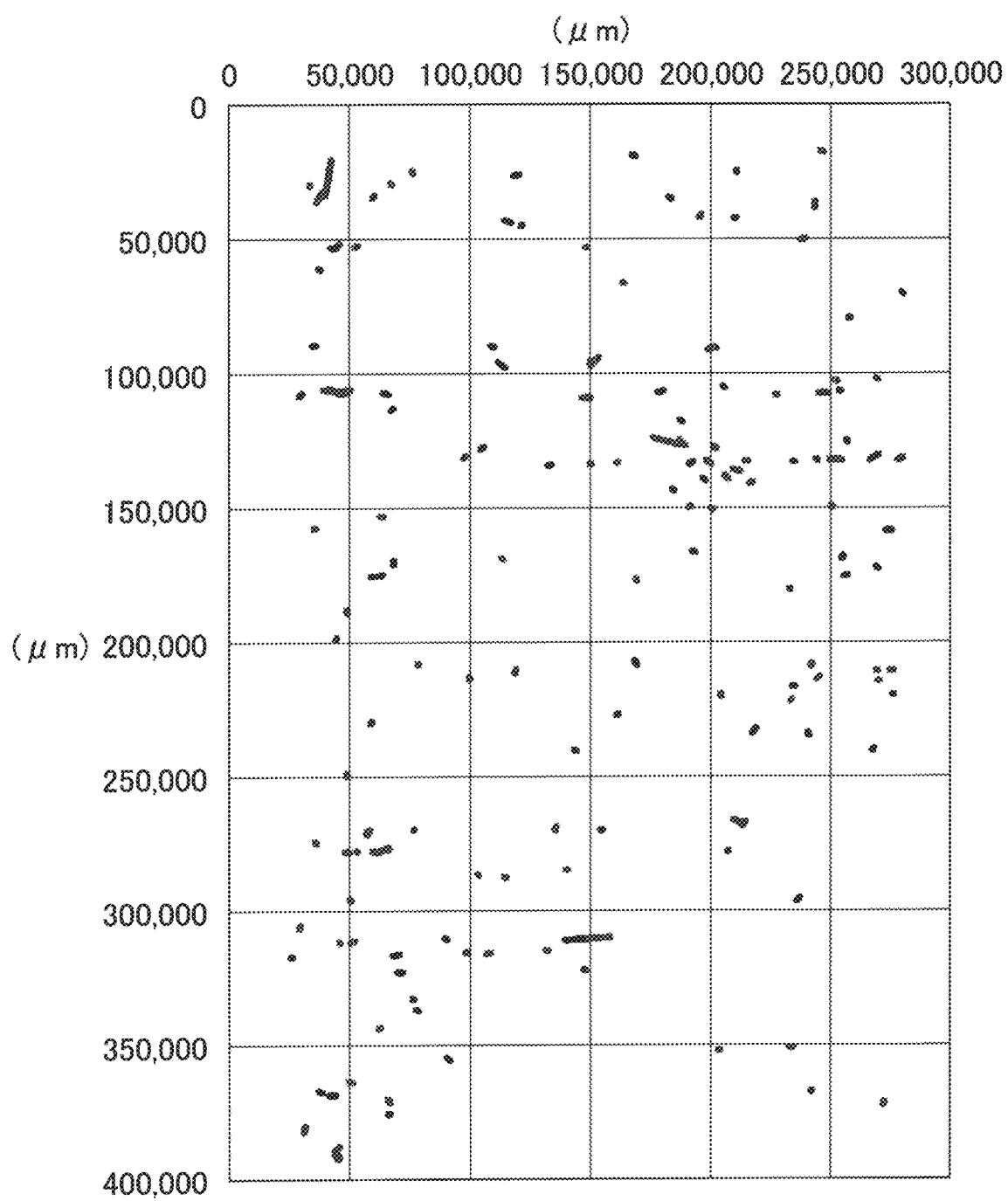
FIG. 8 is a diagram of scratches on the entire surface of a glass substrate in Example 1 in the present disclosure.
Figure 9:
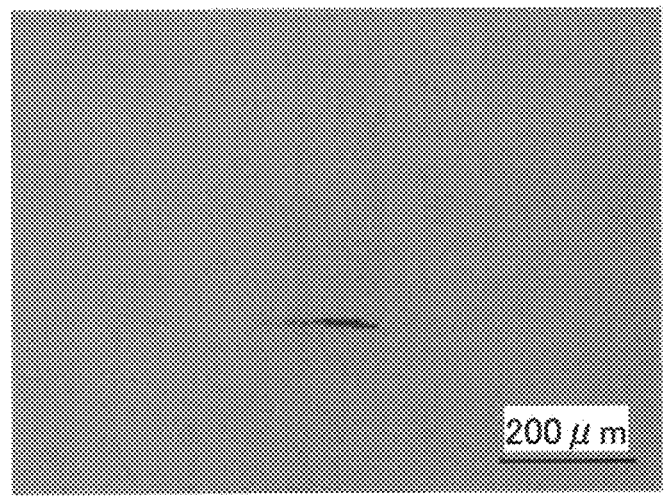
FIG. 9 is an enlarged view of a scratch on the surface of a glass substrate in Example 1 in the present disclosure.

By the above steps, the glass substrate having the holes was produced. A photograph of the second surface of the glass substrate after the annealing step is illustrated in FIG. 8. FIG. 9 illustrates an enlarged photograph of a scratch.

Example 2

An etching step was performed on the glass substrate having the holes obtained in Example 1. The glass substrate having the holes famed was immersed in a hydrofluoric acid solution for etching. By performing the etching step after the annealing step, it was possible to prevent the inner walls of the holes from becoming uneven, to smooth the inner walls of the holes, and to enlarge the diameters of the holes.

Example 3

Next, a method of producing a glass substrate having holes by the production method described in the second embodiment will be described.

A glass substrate substantially the same as in Example 1 was provided.

Next, the laser irradiator illustrated in FIG. 6 was used to have the glass substrate irradiated with a laser to form multiple modified parts. As the laser, a pulsed laser having a wavelength of 532 nm was used and the pulse width was set to 10 ps. Next, an etching step was performed. The glass substrate having the modified parts formed was immersed in a 5%-concentration fluoric acid solution to be etched. This removed the modified parts and formed holes in the glass substrate.

Next, an annealing step was performed. The annealing step was performed under substantially the same conditions as in Example 1.

Thus, the glass substrate having the holes was produced.

Example 4

In Example 4, modified parts were famed by the laser irradiation step as in Example 3, and then, unlike Example 3, the annealing step was performed before the etching step. The annealing step was performed under substantially the same conditions as in Example 1.

After the annealing step, an etching step was performed. The etching step was performed under substantially the same conditions as in Example 2.

Thus, the glass substrate having the holes was produced.

Comparative Example 1

Next, a comparative example will be described. First, a glass substrate substantially the same as in Example 1 was prepared, and substantially the same laser irradiation step was performed to form multiple through-holes in the glass substrate.

Next, an annealing step was performed. The glass substrate was placed directly on the second support substrate. The glass substrate was placed such that the second surface faces the second support substrate.

As the second support substrate, the same one as in Example 1 was used. In other words, the used substrate was a quartz glass substrate having a thermal expansion coefficient of 0.55 ppm/K and dimensions of 940 mm×750 mm×3 mm thick. Thus, the difference in thermal expansion coefficient between the glass substrate and the second support substrate was 3.25 ppm/K.

The glass substrate was held in the slow cooling furnace at 711° C. for two hours, then, cooled down to 650° C. at a rate of 12° C./h, and thereafter, left to cool naturally.

Figure 10:
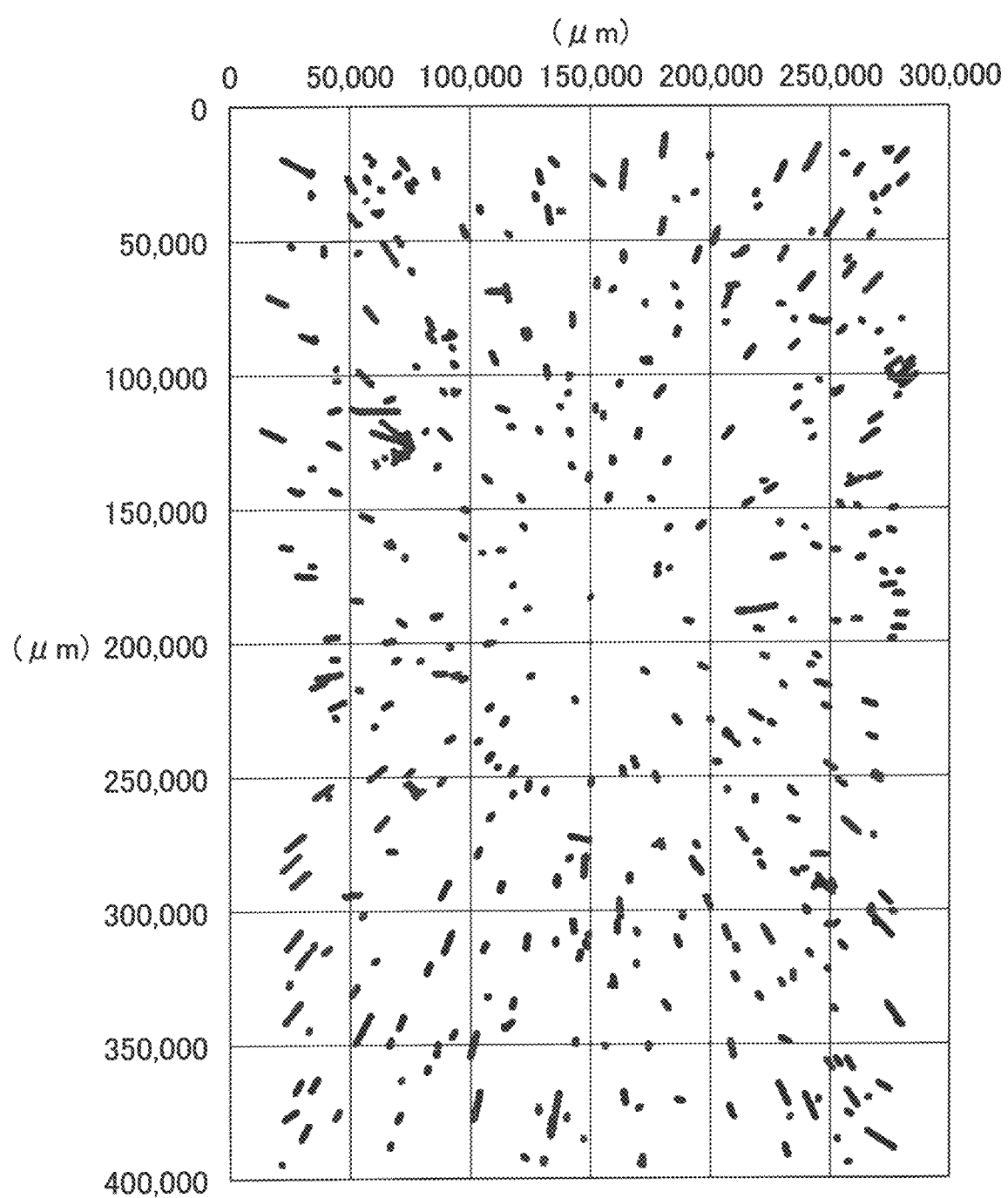
FIG. 10 is a diagram of scratches on the entire surface of a glass substrate in Comparative Example 1 in the present disclosure.

A photograph of the second surface of the glass substrate having the holes after the annealing step is illustrated in FIG. 10.

Comparing the result of Example 1 (FIG. 8) with the result of Comparative Example 1 (FIG. 10), it can be seen that the number of scratches on the second surface of the glass substrate was reduced in Example 1 compared with Comparative Example 1. In particular, it can be seen that radially spread scratches were reduced significantly. As such, by the production method in the present disclosure, scratches on the surface of the glass substrate were controlled significantly.

Comparing the second surface of the glass substrate produced in Examples 2 to 4 with the second surface of the glass substrate produced in Comparative Example 1, the number of scratches was greatly reduced on the second surface of the glass substrate produced in Examples 2 to 4.

Also, comparing the second surface of the glass substrate produced in Example 3 with the second surface of the glass substrate produced in Example 2 and Example 4, Example 3 has a fewer scratches and a fewer deep and large scratches than Example 2 and Example 4. Example 3 has a fewer scratches and a fewer deep and large scratches than Examples 2 and 4 because the order of the etching and annealing steps differs between Example 3 and Examples 2 and 4. In Example 3, the annealing step was performed after the etching step, and in Examples 2 and 4, the etching step was performed after the annealing step.

In this way, according to the production method in the present disclosure, it is possible to reduce residual stress around a hole and in the entirety of a glass substrate by annealing while controlling generation of scratches on the surface of the glass substrate, and to produce the glass substrate with which thermal contraction and strain are less likely to be caused in a later step.

Also, by performing the annealing step after the etching step, it is possible to prevent scratches from deepening and enlarging, and to reduce the number of manifest scratches.

As above, the embodiments have been described. Note that the embodiments described above are presented as examples, and the present inventive concept is not limited by the embodiments described above. The embodiments described above can be implemented in various other forms, and various combinations, omissions, substitutions, changes, and the like can be made within a scope not deviating from the subject matters of the inventive concept. These embodiments and their variations are included in the scope and subject matters of the inventive concept, and are also included in the scope of the inventive concept described in the claims and equivalents thereof.

The invention claimed is:

1. A method of producing a glass substrate having a hole, the method comprising:
    preparing the glass substrate having a first surface and a second surface facing each other;
    forming a hole in the glass substrate with a laser; and
    annealing the glass substrate placed on a first support substrate having a thermal expansion coefficient whose difference from a thermal expansion coefficient of the glass substrate is less than or equal to 1 ppm/K, the first support substrate being placed on a second support substrate having a thermal expansion coefficient of less than or equal to 10 ppm/K,
    wherein the annealing is performed at a temperature greater than or equal to the strain point of the glass substrate and less than or equal to the softening point of the glass substrate.

2. The method of producing the glass substrate having the hole as claimed in claim 1, wherein the forming of the hole with the laser in the glass substrate forms the hole in the glass substrate by having the first surface of the glass substrate irradiated with the laser.

3. The method of producing the glass substrate having the hole as claimed in claim 2, the method further comprising:
    etching the glass substrate after the annealing of the glass substrate.

4. The method of producing the glass substrate having the hole as claimed in claim 2, wherein after the forming of the hole, before the annealing, residual stress around the hole of the glass substrate is greater than or equal to 50 MPa.

5. The method of producing the glass substrate having the hole as claimed in claim 1, wherein the forming of the hole with the laser in the glass substrate includes
    having the first surface of the glass substrate irradiated with a pulsed laser having a wavelength of less than or equal to 1100 nm to form a modified part in the glass substrate, and
    removing the modified part by etching to form a hole in the glass substrate.

6. The method of producing the glass substrate having the hole as claimed in claim 5, wherein after the forming of the hole, before the annealing, residual stress around the hole of the glass substrate is less than or equal to 30 MPa.

7. The method of producing the glass substrate as claimed in claim 1, wherein arithmetic mean roughness Ra of the first surface of the first support substrate in contact with the glass substrate is greater than or equal to 0.1 µm and less than or equal to 2.0 µm.

8. The method of producing the glass substrate as claimed in claim 1, wherein the first support substrate is larger than the glass substrate, and the second support substrate is larger than the first support substrate.

9. The method of producing the glass substrate as claimed in claim 1, wherein the first surface of the second support substrate in contact with the first support substrate has flatness of less than or equal to 600 µm.

10. The method of producing the glass substrate as claimed in claim 1, wherein the first support substrate has a same composition as the glass substrate.

11. The method of producing the glass substrate as claimed in claim 1, wherein the first support substrate has a thermal expansion coefficient whose difference from the thermal expansion coefficient of the glass substrate is less than or equal to 0.1 ppm/K.

12. The method of producing the glass substrate as claimed in claim 1, wherein the second support substrate has a thermal expansion coefficient of less than or equal to 1 ppm/K.

13. The method of producing the glass substrate as claimed in claim 1, wherein the annealing is performed for longer than or equal to 100 minutes.

14. A method of producing a glass substrate having a hole, the method comprising:
    preparing the glass substrate having a first surface and a second surface facing each other;
    forming a hole in the glass substrate with a laser; and
    annealing the glass substrate placed on a first support substrate having a thermal expansion coefficient whose difference from a thermal expansion coefficient of the glass substrate is less than or equal to 1 ppm/K, the first support substrate being placed on a second support substrate having a thermal expansion coefficient of less than or equal to 10 ppm/K,
    wherein during the annealing a first surface of the first support substrate is in uninterrupted contact with an entire surface of the glass substrate and a first surface of the second support substrate is in uninterrupted contact with an entire second surface of the first support substrate opposite the first surface of the first support substrate.

15. The method of producing the glass substrate as claimed in claim 14, wherein the first support substrate has a thermal expansion coefficient whose difference from the thermal expansion coefficient of the glass substrate is less than or equal to 0.1 ppm/K.

16. The method of producing the glass substrate as claimed in claim 14, wherein the second support substrate has a thermal expansion coefficient of less than or equal to 1 ppm/K.

17. The method of producing the glass substrate as claimed in claim 14, wherein the annealing is performed for longer than or equal to 100 minutes.

* * * * *